(12) United States Patent
Shigemoto et al.

(10) Patent No.: US 11,244,922 B2
(45) Date of Patent: Feb. 8, 2022

(54) SEMICONDUCTOR DEVICE (71) Applicant: Mitsubishi Electric Corporation, Tokyo (JP)

(72) Inventors: Takumi Shigemoto, Tokyo (JP); Shohei Ogawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/886,457

(22) Filed: May 28, 2020

(65) Prior Publication Data
US 2021/0043598 A1 Feb. 11, 2021

(30) Foreign Application Priority Data
Aug. 5, 2019 (JP) .............................. JP2019-143546

(51) Int. Cl.
| | |
|---|---|
| H01L 23/00 | (2006.01) |
| H01L 23/498 | (2006.01) |
| H01L 23/04 | (2006.01) |
| H01L 23/08 | (2006.01) |

(52) U.S. Cl.
CPC .............. *H01L 24/40* (2013.01); *H01L 23/04* (2013.01); *H01L 23/08* (2013.01); *H01L 23/49838* (2013.01); *H01L 24/37* (2013.01); *H01L 24/45* (2013.01); *H01L 24/48* (2013.01); *H01L 2224/37099* (2013.01); *H01L 2224/45099* (2013.01); *H01L 2224/48091* (2013.01); *H01L 2224/84801* (2013.01); *H01L 2924/1306* (2013.01); *H01L 2924/13055* (2013.01)

(58) Field of Classification Search
None
See application file for complete search history.

(56) References Cited

U.S. PATENT DOCUMENTS

2006/0244116 A1* 11/2006 Tsunoda ............ H01L 23/49861
257/678
2014/0299982 A1* 10/2014 Minamio .............. H01L 25/162
257/712

(Continued)

FOREIGN PATENT DOCUMENTS

JP 2007-081155 A 3/2007

*Primary Examiner* — Michelle Mandala
*Assistant Examiner* — Jordan M Klein
(74) *Attorney, Agent, or Firm* — Studebaker & Brackett PC (57) ABSTRACT

Provided is a semiconductor device stabilizing bond properties between an electrode terminal provided on a case and an internal wiring connected to a semiconductor element. A semiconductor device includes a base part, a semiconductor element, an electrode terminal, an insulating block, and an internal wiring. The semiconductor element is mounted on the base part. The electrode terminal is held by a case surrounding an outer periphery of the semiconductor element. An end portion of the electrode terminal protrudes toward an inner side of the case. The insulating block is provided on the base part between the semiconductor element and the case. In the internal wiring, one end portion is bonded to the end portion of the electrode terminal on the insulating block, and part of a region extending from the one end portion to the other end portion is bonded to the semiconductor element.

6 Claims, 9 Drawing Sheets

(56) References Cited

U.S. PATENT DOCUMENTS

2015/0371931 A1* 12/2015 Nishida ................ H01L 23/057
                                                    174/255
2018/0204782 A1*  7/2018 Nagamizu ............. H01L 23/492
2018/0240732 A1*  8/2018 Tonedachi ............. H01L 24/29

* cited by examiner

SEMICONDUCTOR DEVICE

FIELD OF THE INVENTION

The present invention relates to a semiconductor device.

DESCRIPTION OF THE BACKGROUND ART

A conventional semiconductor device is made up of a conductive part including a semiconductor element provided on a substrate, a case housing the conductive part, and an electrode terminal integrated with the case and electrically connected to the conductive part. In a semiconductor device described in Japanese Patent Application Laid-Open No. 2007-81155, a first plate-like connection wiring which is not integrated with a case is connected to an external connection terminal and a semiconductor element via a solder material. Furthermore, a second plate-like connection wiring is connected to an external connection terminal and a wiring substrate. These plate-like connection wirings are formed of Cu or a Cu series material.

Required in the conventional semiconductor device is a stabilization of bonding between an electrode terminal held by the case and an internal wiring (the conductive part or the plate-like connection wiring described above) bonded to the semiconductor element.

For example, a temperature of the electrode terminal and internal wiring needs to be increased sufficiently to achieve a favorable bonding by the solder material. However, a bonding area is located on the electrode terminal protruding from the case, thus the temperature tends to be insufficiently increased, and in such a case, the favorable solder bonding cannot be achieved.

A heating means sufficiently transmits heat to both the electrode terminal and the internal wiring by a heating means, however, a substrate on which the semiconductor element is mounted is deformed in accordance with a temperature change such as a temperature rise caused by the heating or a temperature drop after the heating is stopped. In this case, a distance from the electrode terminal to the internal wiring fluctuates, a bonding area decreases, and reliability of the semiconductor device is reduced.

SUMMARY

The present disclosure therefore has been made to solve the above problems, and it is an object of the present disclosure to provide a semiconductor device capable of stabilizing bond properties between an electrode terminal provided on a case and an internal wiring connected to a semiconductor element.

A semiconductor device according to the present disclosure includes a base part, a semiconductor element, an electrode terminal, an insulating block, and an internal wiring. The semiconductor element is mounted on the base part. The electrode terminal is held by a case surrounding an outer periphery of the semiconductor element. An end portion of the electrode terminal protrudes toward an inner side of the case. The insulating block has insulation properties, and is provided on the base part between the semiconductor element and the case. The first end portion of the internal wiring is bonded to the end portion of the electrode terminal on the insulating block, and part of a region extending from the first end portion to the second end portion of the internal wiring is bonded to the semiconductor element.

According to the present disclosure, a semiconductor device capable of stabilizing bond properties between an electrode terminal provided on a case and an internal wiring connected to a semiconductor element can be provided.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
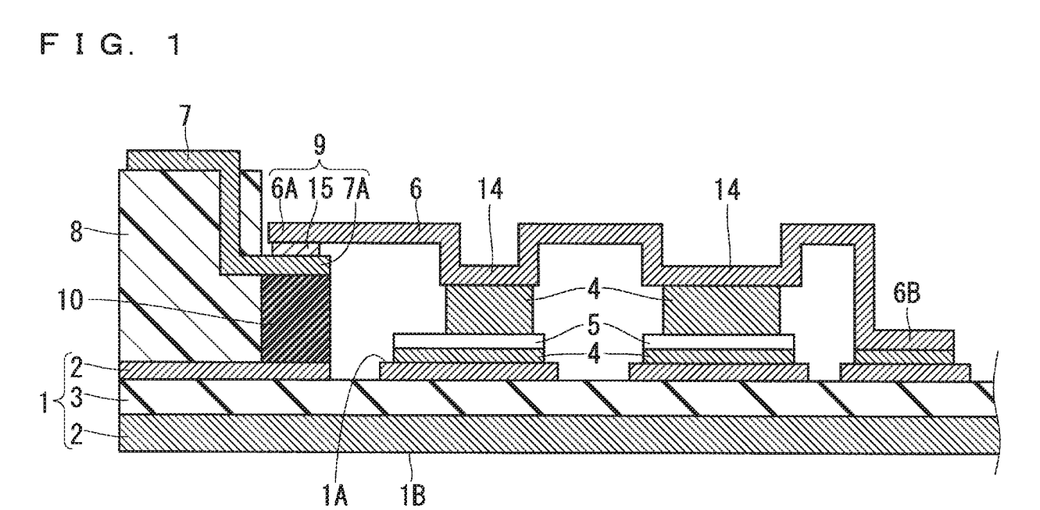
FIG. 1 is a cross-sectional view illustrating a configuration of a semiconductor device according to an embodiment 1.

FIG. 1 is a cross-sectional view illustrating a configuration of a semiconductor device according to an embodiment 1. The semiconductor device includes a base part 1, a semiconductor element 5, a case 8, a main electrode terminal 7, an internal electrode 6, and an insulating block 10.

The base part 1 includes an insulating material and a radiation material. The base part 1 in the embodiment 1 includes an insulating substrate 3 and a metal layer 2 on front and back sides of the insulating substrate 3, and at least the metal layer 2 on the front side is formed as a plurality of patterns. The metal layer 2 is made of Cu or Al, for example. The insulating substrate 3 contains aluminum nitride (AlN) or silicon nitride ($Si_3N_4$) as a material, for example.

The semiconductor element 5 is mounted on a surface 1A of the base part 1. Herein, the back surface of the semiconductor element 5 is bonded to the surface 1A of the base part 1 via a bonding material 4. The bonding material 4 is a plate-like solder, a rod-like solder, or a paste solder containing Sn, for example, however, a material or a shape of the bonding material 4 is not limited thereto. The semiconductor element 5 contains Si or a wideband gap semiconductor having a larger band gap than Si as a material. The wideband gap semiconductor is SiC, GaN, or diamond, for example. The semiconductor element 5 is an insulated gate bipolar transistor (IGBT), a metal oxide semiconductor field effect transistor (MOSFET), or a Schottky barrier diode, for example. For example, the semiconductor element 5 is a power semiconductor element such as a reverse conducting IGBT (RC-IGBT) in which an IGBT and a diode are integrated in one semiconductor chip. In FIG. 1, the two semiconductor elements 5 are mounted on the surface 1A of the base part 1, however, the number of the mounted elements is not limited thereto. The semiconductor device includes the required number of semiconductor elements 5 as usage.

The case 8 is provided to surround an outer periphery of the semiconductor element 5. The case 8 has a frame-like shape, for example, and is bonded to the surface 1A of the base part 1 via an adhesive agent (not shown). FIG. 1 illustrates only one side of the frame-like shape. The case 8 contains a resin having a high thermal softening point as a material. The resin having the high thermal softening point is a material which is not thermally deformed in an operation temperature range in the semiconductor device and has insulation properties. The resin having the high thermal softening point is a polyphenylene sulfide resin (PPS), for example, and a thermal softening temperature thereof is equal to or larger than 280° C. The case 8 is formed into a container shape having the base part 1 as a bottom surface. The semiconductor element 5 housed inside the container shape is sealed by a sealing material (not shown). The sealing material is a silicone gel or an epoxy resin, for example, but is not limited thereto. Any resin is applicable as the sealing material as long as it has elasticity sufficient to ensure adhesion and heat resistance sufficient to ensure reliability. The sealing material preferably has heat resistance of 150° C. or more, for example.

The main electrode terminal 7 has a plate-like shape. The main electrode terminal 7 is held by the case 8. An end portion 7A of the main electrode terminal 7 protrudes toward an inner side of the frame-like shape of the case 8. The main electrode terminal 7 in the embodiment 1 is held in a state of being inserted into the case 8. That is to say, the main electrode terminal 7 and the case 8 are integrated with each other. Such a main electrode terminal 7 is manufactured to be integrated with the case 8 by insert molding. The main electrode terminal 7 is a planar plate having a thickness of approximately 0.5 mm to 1.2 mm, for example, and is made of Cu or a material containing Cu. Even when the semiconductor element 5 is a power semiconductor element, such a main electrode terminal 7 is capable of flowing a large current to the semiconductor element 5.

The internal electrode 6 is a conductive body having an elongated plate-like shape, and is an internal wiring connecting the main electrode terminal 7 and the semiconductor element 5. One end portion 6A of the internal electrode 6 is bonded to the end portion 7A of the main electrode terminal 7 on the insulating block 10 described hereinafter. A first bonding part 14 corresponding to part of a region extending from the one end portion 6A to the other end portion 6B of the internal electrode 6 is bonded to a surface of the semiconductor element 5. A bonding surface of the first bonding part 14 in the internal electrode 6 and the surface of the semiconductor element 5 are parallel to each other. The two planar surfaces parallel to each other are bonded via the bonding material 4. The internal electrode 6 is a planar plate having a thickness of approximately 0.5 mm to 1.2 mm, for example, and is made of Cu or a material containing Cu. Even when the semiconductor element 5 is a power semiconductor element, such an internal electrode 6 is capable of flowing a large current to the semiconductor element 5. The one end portion 6A can also be referred to as the first end portion and the other end portion 6B can also be referred to as the second end portion.

The insulating block 10 is provided on a surface 1A of the base part 1 between the semiconductor element 5 and the case 8. The one end portion 6A of the internal electrode 6 and the end portion 7A of the main electrode terminal 7 are bonded by a bonding material 15 on an upper surface of the insulating block 10. Accordingly, the main electrode terminal 7 and the semiconductor element 5 are electrically connected, that is to say, wired. A bonding area where the internal electrode 6 and the main electrode terminal 7 are bonded is referred to as a second bonding part 9.

A height of the upper surface of the insulating block 10 coincides with a lower surface of the end portion 7A of the main electrode terminal 7 protruding from the case 8. The main electrode terminal 7 and the internal electrode 6 in the second bonding part 9 are held by the insulating block 10 from a lower side.

Each of the one end portion 6A of the internal electrode 6 and the end portion 7A of the main electrode terminal 7 in the second bonding part 9 has a planar surface parallel to the surface of the semiconductor element 5. The two planar surfaces parallel to each other are bonded via the bonding material 15 in the second bonding part 9. The bonding material 15 is a solder, for example.

The insulating block 10 in the embodiment 1 is provided along an inner side of the case 8 as illustrated in FIG. 1. A shape of the insulating block 10 is preferably a rectangular parallelepiped, but is not limited thereto. Any shape is applicable as long as it has an area sufficiently having contact with the base part 1 and the second bonding part 9 and a certain height from the base part 1 is ensured.

The insulating block 10 is made of a material having a high thermal conductivity and insulation properties such as aluminum nitride and silicon nitride. According to such a configuration, the thermal conductivity between the second bonding part 9 and the base part 1 is improved.

Figure 2:
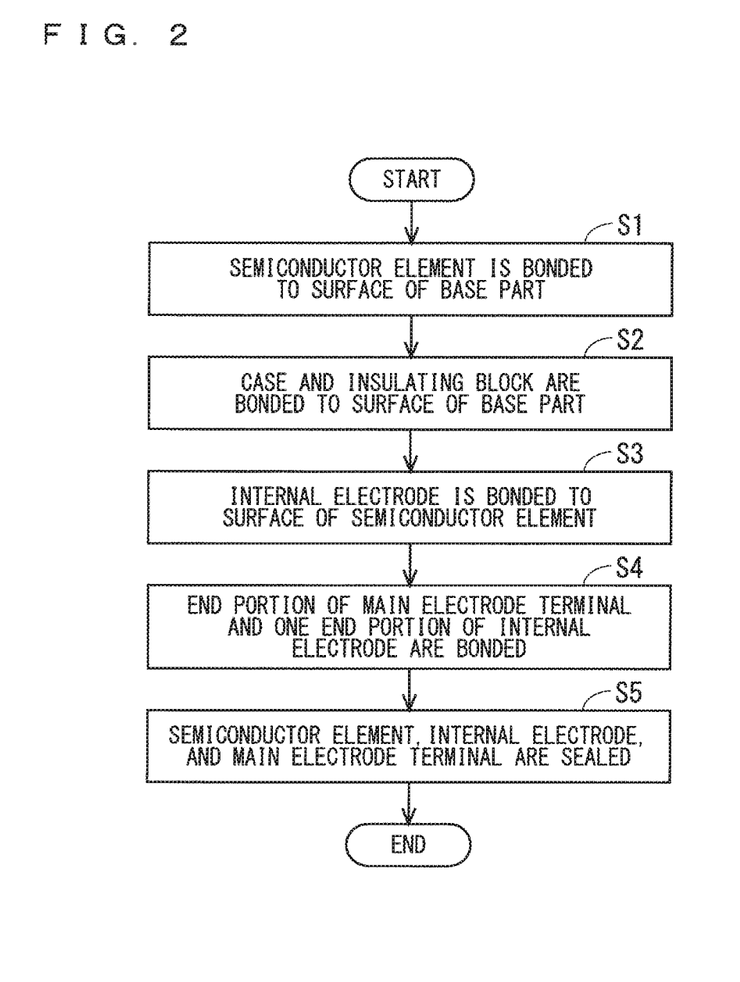
FIG. 2 is a flow chart illustrating a method of manufacturing the semiconductor device according to the embodiment 1.

FIG. 2 is a flow chart illustrating a method of manufacturing the semiconductor device according to the embodiment 1. Described herein is an example that the main electrode terminal 7 and the internal electrode 6 are bonded by a solder, that is to say, the bonding material 15 is a solder.

In Step S1, the back surface of the semiconductor element 5 is bonded to the surface 1A of the base part 1 by the bonding material 4. The bonding material 4 is a paste-like solder or a plate-like solder. In this case, the bonding area is heated by contact heating from a back surface 1B of the base part 1. A heating temperature is set to approximately 230 to 300° C. corresponding to a melting point of the solder containing Sn.

In Step S2, the case 8 and the insulating block 10 are bonded to the surface 1A of the base part 1. For example, an adhesive agent containing silicone or an adhesive agent containing an epoxy resin are applied to the bonding surfaces. The bonding surfaces are heated at a temperature of approximately 150 to 300° C., thus the case 8 and the insulating block 10 are bonded to the base part 1.

In Step S3, the first bonding part 14 of the internal electrode 6 is bonded to the surface of the semiconductor element 5 and the other end portion 6B of the internal electrode 6 is bonded to the surface 1A of the base part 1 by the bonding material 4. In the manner similar to Step S2, the bonding area is heated by contact heating from the back surface 1B of the base part 1. A heating temperature is set to approximately 230 to 300° C. corresponding to a melting point of the solder containing Sn.

In Step S4, the end portion 7A of the main electrode terminal 7 and the one end portion 6A of the internal electrode 6 are bonded by the bonding material 15. The bonding material 15 is a solder. In this case, in the manner similar to Step S3, the second bonding part 9 is heated from the back surface 1B of the base part 1. The insulating block 10 is provided between the base part 1 and the second bonding part 9, that is to say, on a lower part of the second bonding part 9. The insulating block 10 is made of a material having a sufficient thermal conductivity such as aluminum nitride and silicon nitride. The heat supplied to the base part 1 is efficiently conducted to the second bonding part 9 through the insulating block 10, thus the temperature of the second bonding part 9 is easily increased. As a result, a favorable solder bonding is formed.

The second bonding part 9 in which the main electrode terminal 7 and the internal electrode 6 are bonded is held by the insulating block 10 from the lower side, thus a stable solder bonding process is achieved. As a result, the favorable second bonding part 9 is formed. Step S4 can be executed at the same time as Step S3, and productivity is improved in this case.

In Step S5, the semiconductor element 5, the internal electrode 6, and the main electrode terminal 7 are sealed with a sealing material.

The method of manufacturing the semiconductor device is finished through the above processes.

To summarize, the semiconductor device according to the embodiment 1 includes the base part 1, the semiconductor element 5, the main electrode terminal 7, the insulating block 10, and the internal electrode 6. The semiconductor element 5 is mounted on the base part 1. The main electrode terminal 7 is held by the case 8 surrounding the outer periphery of the semiconductor element 5, and the end portion 7A protrudes toward the inner side of the case 8. The insulating block 10 has the insulation properties, and is provided on the base part 1 between the semiconductor element 5 and the case 8. The one end portion 6A of the internal electrode 6 is bonded to the end portion 7A of the main electrode terminal 7 on the insulating block 10, and the part of the region extending from the one end portion 6A to the other end portion 6B of the internal electrode 6 is bonded to the semiconductor element 5.

According to such a configuration, bond properties between the main electrode terminal 7 provided on the case 8 and the internal electrode 6 connected to the semiconductor element 5 is stabilized. Specifically, in the process of manufacturing the semiconductor device, the insulating block 10 efficiently transmits the heat applied to the back surface 1B of the base part 1 to the second bonding part 9. Thus, the temperature of the second bonding part 9 is easily increased. As a result, the second bonding part 9 in the favorable bonding state is formed. Furthermore, the main electrode terminal 7 and the internal electrode 6 are held fixed on the insulating block 10 in the bonding process, thus the bond properties are improved. The main electrode terminal 7 and the internal electrode 6 each having the plate-like shape parallelly overlap with each other on the insulating block 10, thus the bonding area is increased and the bond properties are improved.

As a result, for example, even when the semiconductor element 5 is a power semiconductor element, the semiconductor device is capable of flowing a large current between the semiconductor element 5 and the main electrode terminal 7.

In Step S2, the case 8 and the insulating block 10 are described as separate components, however, the case 8, the main electrode terminal 7, and the insulating block may be an integrated component.

The one end portion 6A of the internal electrode 6 and the end portion 7A of the main electrode terminal 7 in the embodiment 1 are bonded by the solder.

According to such a configuration, in the process of manufacturing the semiconductor device, the heat applied to the back surface B of the base part 1 is efficiently transmitted to the second bonding part 9 via the insulating block 10. Thus, the temperature of the second bonding part 9 is easily increased, and the favorable solder bonding is formed.

Embodiment 2

A semiconductor device according to an embodiment 2 is described. The embodiment 2 is a subordinate concept of the embodiment 1, and the semiconductor device in the embodiment 2 includes each configuration of the semiconductor device in the embodiment 1. The description of the configuration and operation similar to those in the embodiment 1 is omitted.

Figure 3:
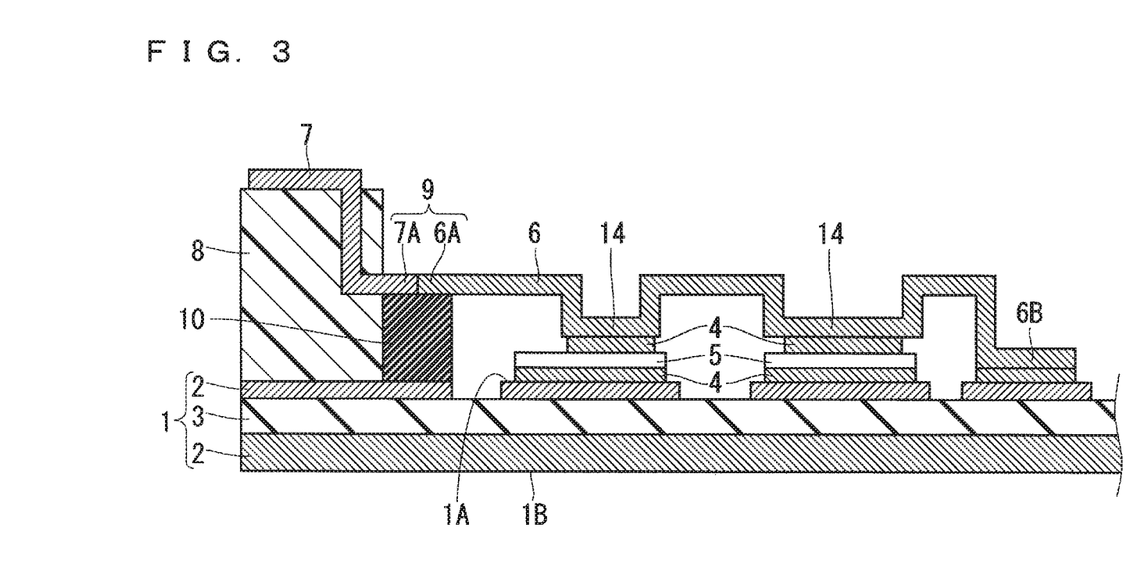
FIG. 3 is a cross-sectional view illustrating a configuration of a semiconductor device according to an embodiment 2.
Figure 4:
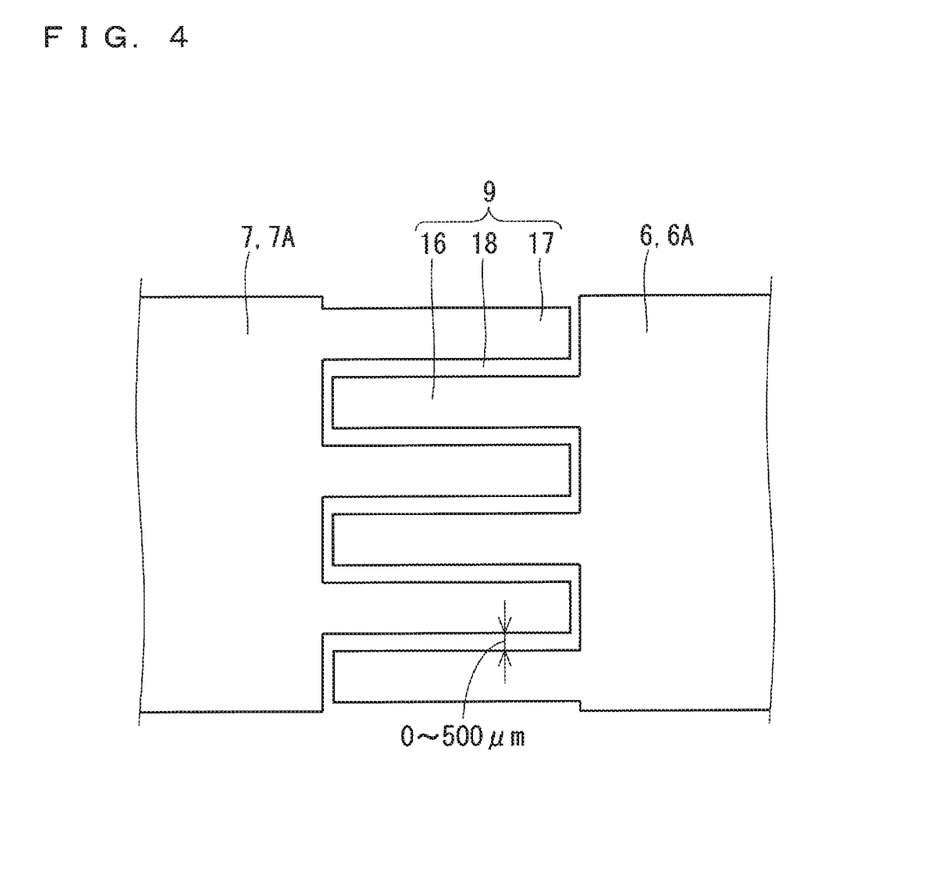
FIG. 4 is a top view illustrating a configuration of a bonding part between a main electrode terminal and an internal electrode in the semiconductor device according to the embodiment 2.

FIG. 3 is a cross-sectional view illustrating a configuration of the semiconductor device according to the embodiment 2. FIG. 4 is a top view illustrating a configuration of the second bonding part 9 in which the main electrode terminal 7 and the internal electrode 6 are bonded in the semiconductor device according to the embodiment 2. Configurations of the base part 1, the semiconductor element 5, the case 8, and the insulating block 10 in the embodiment 2 are similar to those in the embodiment 1.

A tip portion of the one end portion 6A of the internal electrode 6 and a tip portion of the end portion 7A of the main electrode terminal 7 have comb-like shapes 16 and 17 in a planar view, respectively. The comb-like shape 16 of the internal electrode 6 is fitted to the comb-like shape 17 of the main electrode terminal 7. A positional relationship between the internal electrode 6 and the main electrode terminal 7 in a plane (an up-down direction in FIG. 4) is appropriately maintained by these comb-like shapes 16 and 17. The comb-like shapes 16 and 17 of the internal electrode 6 and the main electrode terminal 7 are not limited to those illustrated in FIG. 4. Any shape is applicable as long as they can be fitted to each other.

0 to 500 μm of clearance, that is to say, a gap 18 is provided between a side surface of the comb-like shape 16 of the internal electrode 6 and a side surface of the comb-like shape 17 of the main electrode terminal 7. A solder (not shown in FIG. 4) filling the gap 18 bonds the side surface of the comb-like shape 16 of the internal electrode 6 and the side surface of the comb-like shape 17 of the main electrode terminal 7. Accordingly, the main electrode terminal 7 and the semiconductor element 5 are wired.

A method of manufacturing the semiconductor device according to the embodiment 2 is described. Steps S1 and S2 in the flow chart illustrated in FIG. 2 are similar to those in the embodiment 1.

In Step S3, the first bonding part 14 of the internal electrode 6 is bonded to the surface of the semiconductor element 5 and the other end portion 6B of the internal electrode 6 is bonded to the surface 1A of the base part 1 by the bonding material 4. The bonding material 4 is a paste-like solder or a plate-like solder. In this case, the internal electrode 6 is positioned such that the comb-like shape 16 provided on the one end portion 6A is fitted to the comb-like shape 17 of the end portion 7A of the main electrode terminal 7, then is bonded to the semiconductor element 5.

Steps S4 and S5 are similar to those in the embodiment 1.

Figure 5:
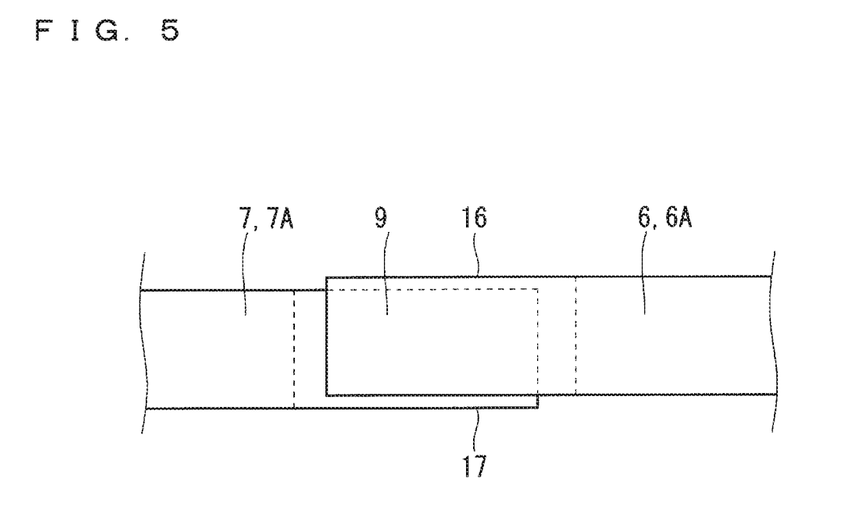
FIG. 5 is a side view enlarging the configuration of the bonding part between the main electrode terminal and the internal electrode in the semiconductor device according to the embodiment 2.

FIG. 5 is a side view enlarging the configuration of the second bonding part 9 in which the main electrode terminal 7 and the internal electrode 6 are bonded in the semiconductor device according to the embodiment 2. The one end portion 6A of the internal electrode 6 is disposed parallel to the end portion 7A of the main electrode terminal 7. In this case, the side surface of the comb-like shape 17 of the main electrode terminal 7 and the side surface of the comb-like shape 16 of the internal electrode 6 overlap with each other in a side view. The gap 18 is filled with the solder, thus the sufficiently large bonding area is ensured in bonding the main electrode terminal 7 and the internal electrode 6, and the favorable bonding state is formed.

Figure 6:
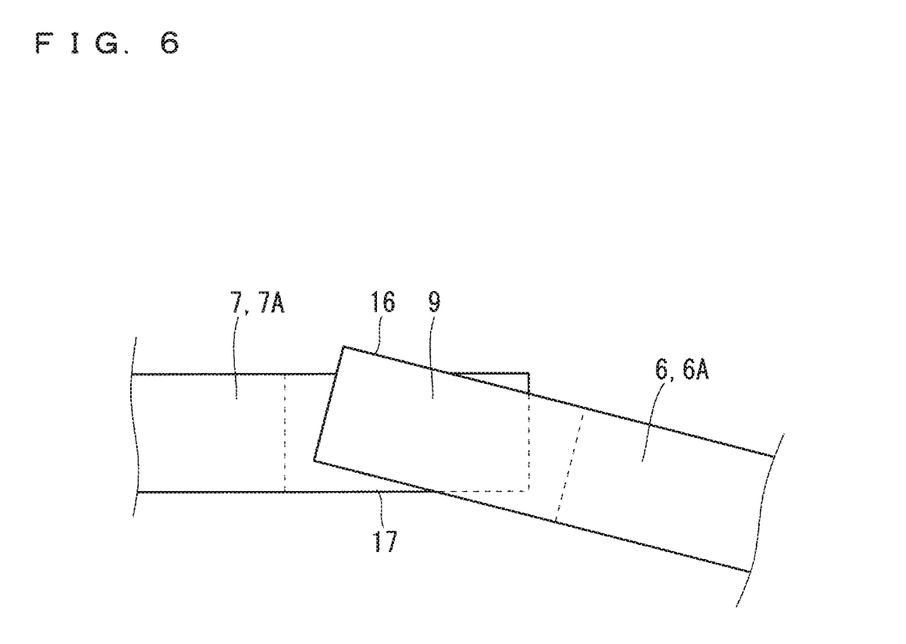
FIG. 6 is a side view illustrating another configuration of the bonding part between the main electrode terminal and the internal electrode in the semiconductor device according to the embodiment 2.

FIG. 6 is a side view illustrating another configuration of the second bonding part 9 in which the main electrode terminal 7 and the internal electrode 6 are bonded in the semiconductor device. A deformation may occur in the base part 1 or the internal electrode 6, for example, due to the heating in the process of manufacturing the semiconductor device described above. There is a possibility that the one end portion 6A of the internal electrode 6 is connected to be inclined with respect to the end portion 7A of the main electrode terminal 7. Even in such a state, the side surface of the comb-like shape 17 of the main electrode terminal 7 and the side surface of the comb-like shape 16 of the internal electrode 6 overlap with each other in a side view. Thus, the sufficiently large bonding area is ensured, and the favorable bonding state is formed.

To summarize the above description, the one end portion 6A of the internal electrode 6 and the end portion 7A of the main electrode terminal 7 in the embodiment 2 have the comb-like shapes 16 and 17 in a planar view, respectively. The comb-like shape 16 of the internal electrode 6 is fitted to the comb-like shape 17 of the main electrode terminal 7. The side surface of the comb-like shape 16 of the internal electrode 6 and the side surface of the comb-like shape 17 of the main electrode terminal 7 are bonded to each other.

Even when the positional relationship between the main electrode terminal 7 and the internal electrode 6 in the second bonding part 9 fluctuates due to a temperature change in the process of manufacturing the semiconductor device, the main electrode terminal 7 and the internal electrode 6 are fitted to each other before the bonding, thus the positional relationship therebetween is appropriately corrected. The main electrode terminal 7 and the internal electrode 6 are bonded in the state described above, thus formed is the second bonding part 9 in which a residual stress is small and the sufficient bonding area is ensured. As a result, the second bonding part 9 and the wiring which are electrically stable are formed, and the reliability of the semiconductor device is improved.

Embodiment 3

A semiconductor device according to an embodiment 3 is described. The embodiment 3 is a subordinate concept of the embodiment 1, and the semiconductor device in the embodiment 3 includes each configuration of the semiconductor device in the embodiment 1. The description of the configuration and operation similar to those in the embodiment 1 or 2 is omitted.

Figure 7:
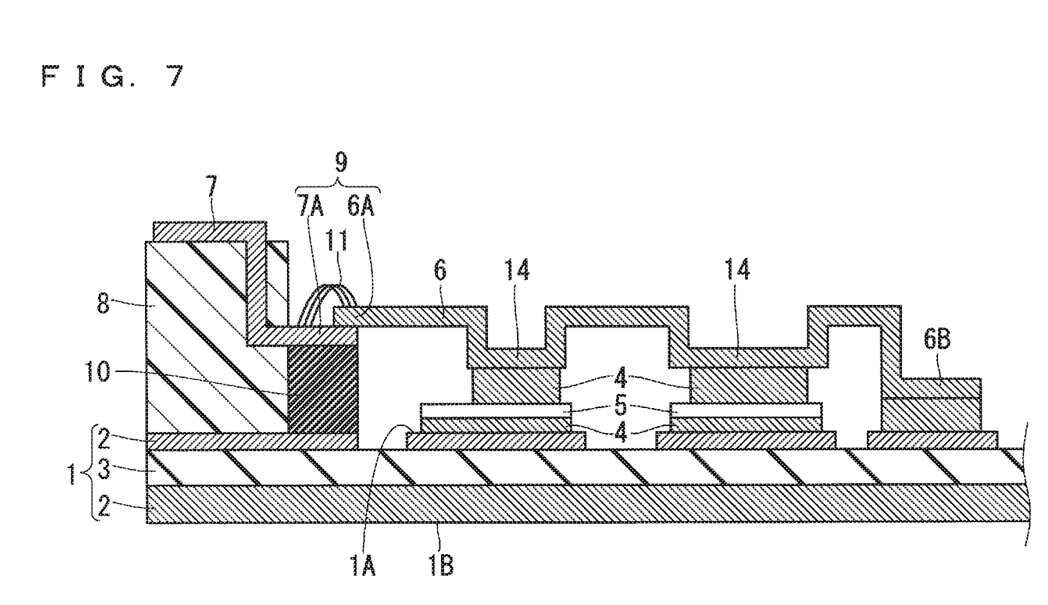
FIG. 7 is a cross-sectional view illustrating a configuration of a semiconductor device according to an embodiment 3.
Figure 8:
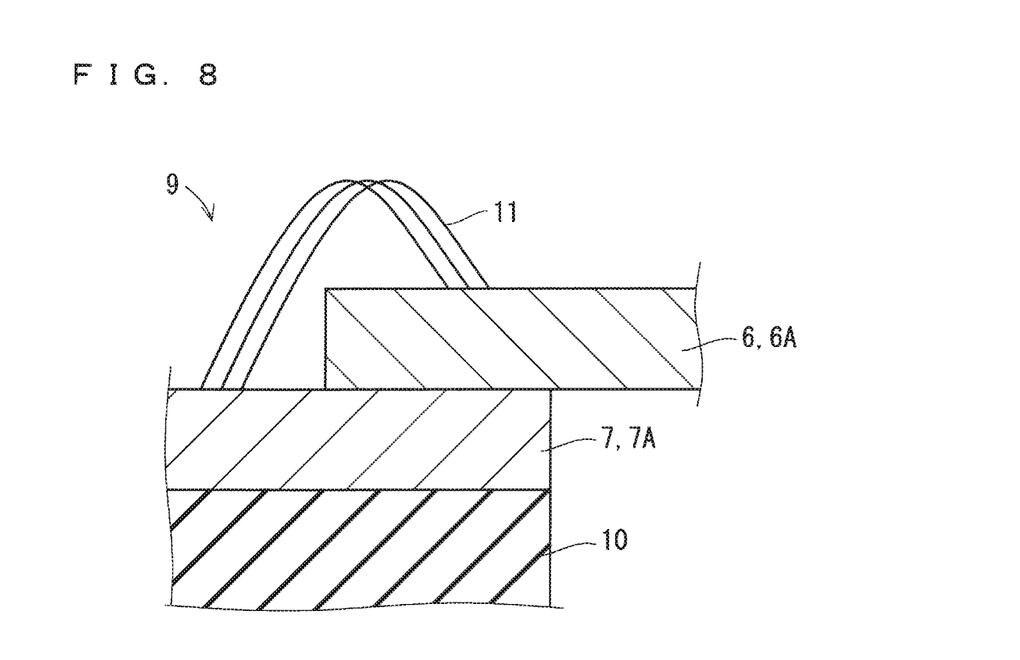
FIG. 8 is a cross-sectional view enlarging a configuration of a bonding part between a main electrode terminal and an internal electrode in the semiconductor device according to the embodiment 3.

FIG. 7 is a cross-sectional view illustrating a configuration of the semiconductor device according to the embodiment 3. FIG. 8 is a cross-sectional view enlarging the configuration of the second bonding part 9 in which the main electrode terminal 7 and the internal electrode 6 are bonded in the semiconductor device according to the embodiment 3.

Configurations of the base part 1, the semiconductor element 5, the case 8, and the insulating block 10 in the embodiment 3 are similar to those in the embodiment 1. The shapes and the arrangement of the internal electrode 6 and the main electrode terminal 7 in the embodiment 3 are similar to those in the embodiment 1, however, the one end portion 6A of the internal electrode 6 and the end portion 7A of the main electrode terminal 7 are bonded by metal wires 11 on the insulating block 10. Accordingly, the main electrode terminal 7 and the semiconductor element 5 are wired. In FIG. 7, the internal electrode 6 and the main electrode terminal 7 are bonded by the three metal wires 11, however, the number of the metal wires 11 is not limited thereto. The required number of metal wires 11 is provided in accordance with a current density of a current flowing in the semiconductor element 5, for example. The metal wire 11 is made of Al, Ag, Cu, or Au. Herein, the metal wire 11 is a linear body having a circular cross section, however, a shape of the metal wire 11 is not limited thereto. For example, the metal wire 11 may be formed of a band of a plurality of copper plates each having a quadrate cross section.

A method of manufacturing the semiconductor device according to the embodiment 3 is described. Steps S1 to S3 in the flow chart illustrated in FIG. 2 are similar to those in the embodiment 1.

In Step S4, the end portion 7A of the main electrode terminal 7 and the one end portion 6A of the internal electrode 6 are bonded by the metal wires 11. This process is a so-called wire bonding process, and the metal wire 11 and the main electrode terminal 7 or the internal electrode 6 are solid-phase bonded by ultrasonic bonding while receiving a constant load. The bonding method is not limited to the ultrasonic bonding, however, any method is applicable as long as a structure capable of supplying a required current and voltage from the main electrode terminal 7 to the semiconductor element 5 can be formed.

Step S5 is similar to that in the embodiment 1.

To summarize the above description, the one end portion 6A of the internal electrode 6 and the end portion 7A of the main electrode terminal 7 in the embodiment 3 are bonded by at least one metal wire 11.

The lower side of the second bonding part 9 is held by the insulating block 10 in the wire bonding process of bonding the main electrode terminal 7 and the internal electrode 6, thus the stable bonding of the metal wire 11 is formed. As a result, the second bonding part 9 and the wiring which are electrically stable are formed, and the reliability of the semiconductor device is improved.

Embodiment 4

A semiconductor device according to an embodiment 4 is described. The embodiment 4 is a subordinate concept of the embodiment 1, and the semiconductor device in the embodiment 4 includes each configuration of the semiconductor device in the embodiment 1. The description of the configuration and operation similar to those in any of the embodiments 1 to 3 is omitted.

Figure 9:
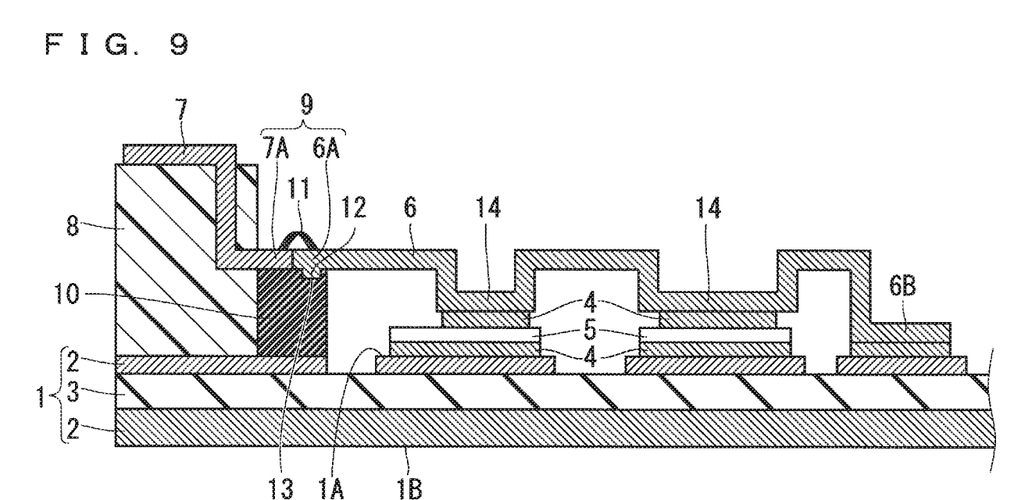
FIG. 9 is a cross-sectional view illustrating a configuration of a semiconductor device according to an embodiment 4.
Figure 10:
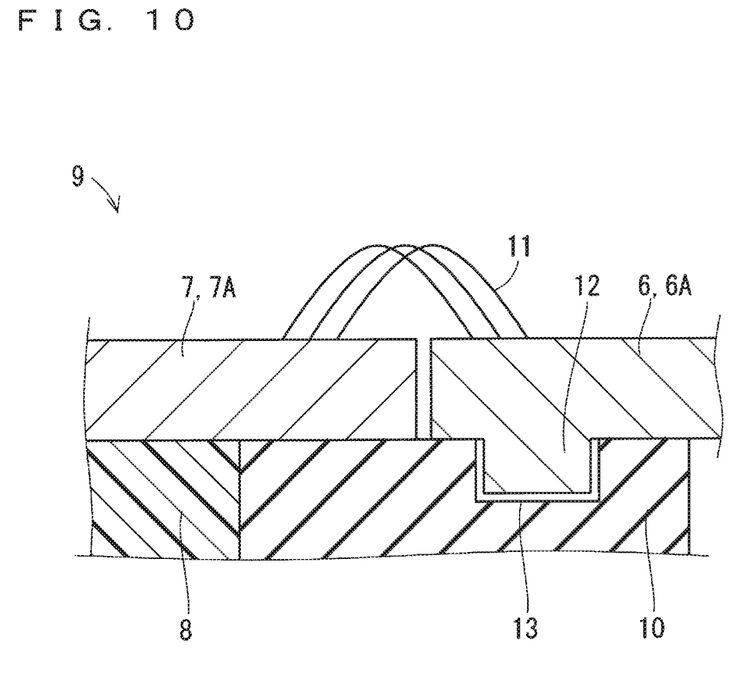
FIG. 10 is a cross-sectional view enlarging a configuration of a bonding part between a main electrode terminal and an internal electrode in the semiconductor device according to the embodiment 4.

FIG. 9 is a cross-sectional view illustrating a configuration of the semiconductor device according to the embodiment 4. FIG. 10 is a cross-sectional view enlarging the configuration of the second bonding part 9 in which the main electrode terminal 7 and the internal electrode 6 are bonded in the semiconductor device according to the embodiment 4.

Configurations of the base part 1, the semiconductor element 5, the case 8, and the insulating block 10 in the embodiment 4 are similar to those in the embodiment 1.

A protruding part 12 is provided on the one end portion 6A of the internal electrode 6. A depression part 13 fitted to the protruding part 12 of the internal electrode 6 is provided on the upper surface of the insulating block 10. The protruding part 12 of the internal electrode 6 and the depression part 13 of the insulating block 10 are fitted to each other, thus a position of the internal electrode 6 is fixed. The protruding part 12 preferably has a circular-hole shape and the depression part 13 preferably has an elongated-hole shape in consideration of a margin for a positional deviation of the protruding part 12 and the depression part 13. However, any shape is applicable as long as the position of the internal electrode 6 can be fixed by the protruding part 12 and the depression part 13.

The one end portion 6A of the internal electrode 6 and the end portion 7A of the main electrode terminal 7 are bonded by the metal wires 11 on the insulating block 10. Accordingly, the main electrode terminal 7 and the semiconductor element 5 are wired. The configuration of the metal wire 11 and the modification example thereof are similar to those in the embodiment 1.

A method of manufacturing the semiconductor device according to the embodiment 4 is described. Steps S1 and S2 in the flow chart illustrated in FIG. 2 are similar to those in the embodiment 1.

In Step S3, the first bonding part 14 of the internal electrode 6 is bonded to the surface of the semiconductor element 5 and the other end portion 6B of the internal electrode 6 is bonded to the surface 1A of the base part 1 by the bonding material 4. The bonding material 4 is a paste-like solder or a plate-like solder. In this case, the internal electrode 6 is positioned such that the protruding part 12 provided on the one end portion 6A is fitted to the depression part 13 of the insulating block 10, then is bonded to the semiconductor element 5.

Steps S4 and S5 are similar to those in the embodiment 3.

To summarize the above description, the one end portion 6A of the internal electrode 6 in the semiconductor device according to the embodiment 4 includes the protruding part 12. The insulating block 10 includes the depression part 13 fitted to the protruding part 12 of the internal electrode 6.

In the wire bonding process of bonding the main electrode terminal 7 and the internal electrode 6, the bonding surface of each of the main electrode terminal 7 and the internal electrode 6 and the metal wire 11 are fixed. Then, the two bonding surfaces are located in the same plane. Thus, the wiring of the metal wire 11 is easily formed, and a length of the metal wire 11 can be reduced. Thus, electrical resistance is reduced, and a heat generation caused by the current flowing in the metal wire 11 is also reduced. As a result, a larger current can be flowed between the main electrode terminal 7 and the semiconductor element 5.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a base part;
a semiconductor element mounted on the base part;
an electrode terminal held by a case surrounding an outer periphery of the semiconductor element and having an end portion protruding toward an inner side of the case;
an insulating block having insulation properties and provided on the base part between the semiconductor element and the case; and
an internal wiring in which a first end portion is bonded to the end portion of the electrode terminal on and directly above the insulating block and part of a region extending from the first end portion to a second end portion is bonded to the semiconductor element, wherein
the case and the insulating block are bonded to the base part via an adhesive, and
the electrode terminal directly contacts the insulating block.

2. The semiconductor device according to claim 1, wherein
the first end portion of the internal wiring and the end portion of the electrode terminal are bonded by a solder.

3. The semiconductor device according to claim 1, wherein
the first end portion of the internal wiring and the end portion of the electrode terminal are bonded by a metal wire.

4. The semiconductor device according to claim 1, wherein
the end portion of the electrode terminal has a plate shape, and
the internal wiring has a plate shape and electrically connects the end portion of the electrode terminal and the semiconductor element.

5. A semiconductor device, comprising:
a base part;
a semiconductor element mounted on the base part;
an electrode terminal held by a case surrounding an outer periphery of the semiconductor element and having an end portion protruding toward an inner side of the case;
an insulating block having insulation properties and provided on the base part between the semiconductor element and the case; and
an internal wiring in which a first end portion is bonded to the end portion of the electrode terminal on the insulating block and part of a region extending from the first end portion to a second end portion is bonded to the semiconductor element, wherein
each of the first end portion of the internal wiring and the end portion of the electrode terminal has a comb shape in a planar view,
the comb shape of the internal wiring is fitted to the comb shape of the electrode terminal, and
a side surface of the comb shape of the internal wiring and a side surface of the comb shape of the electrode terminal are bonded to each other.

6. A semiconductor device, comprising:
a base part;
a semiconductor element mounted on the base part;
an electrode terminal held by a case surrounding an outer periphery of the semiconductor element and having an end portion protruding toward an inner side of the case;
an insulating block having insulation properties and provided on the base part between the semiconductor element and the case; and
an internal wiring in which a first end portion is bonded to the end portion of the electrode terminal on the insulating block and part of a region extending from the first end portion to a second end portion is bonded to the semiconductor element, wherein
the first end portion of the internal wiring and the end portion of the electrode terminal are bonded by a metal wire,
the first end portion of the internal wiring includes a protruding part, and
the insulating block includes a depression part fitted to the protruding part of the internal wiring.

* * * * *